United States Patent
Lo et al.

(10) Patent No.: US 8,766,237 B2
(45) Date of Patent: Jul. 1, 2014

(54) HOMO-MATERIAL HETEROPHASED QUANTUM WELL

(75) Inventors: I-Kai Lo, Kaohsiung (TW); Yu-Chi Hsu, Kaohsiung (TW); Chia-Ho Hsieh, Kaohsiung (TW); Wen-Yuan Pang, Kaohsiung (TW); Ming-Chi Chou, Kaohsiung (TW)

(73) Assignee: National Sun Yat-Sen University, Kaohsiung (TW)

( * ) Notice: Subject to any disclaimer, the term of this patent is extended or adjusted under 35 U.S.C. 154(b) by 417 days.

(21) Appl. No.: 13/009,545

(22) Filed: Jan. 19, 2011

(65) Prior Publication Data

US 2012/0043528 A1 Feb. 23, 2012

(30) Foreign Application Priority Data

Aug. 23, 2010 (TW) ............... 99128136 A

(51) Int. Cl.
 *H01L 33/32* (2010.01)
 *H01L 33/00* (2010.01)
 *H01L 21/00* (2006.01)

(52) U.S. Cl.
 USPC ...... 257/22; 257/103; 257/628; 257/E33.003; 257/E33.014; 438/47

(58) Field of Classification Search
 USPC ............ 257/28, E29.073, 103, 628, E33.003, 257/E33.014; 438/47
 See application file for complete search history.

(56) References Cited

U.S. PATENT DOCUMENTS

| 6,229,151 | B1 | 5/2001 | Takeuchi et al. | |
| 7,034,330 | B2 * | 4/2006 | Udagawa | 257/16 |
| 7,649,195 | B2 | 1/2010 | Lee et al. | |
| 7,674,643 | B2 | 3/2010 | Lee et al. | |
| 8,030,682 | B2 * | 10/2011 | Fujikura | 257/103 |
| 2002/0084467 | A1 * | 7/2002 | Krames et al. | 257/103 |
| 2004/0079959 | A1 * | 4/2004 | Udagawa | 257/103 |
| 2009/0050928 | A1 * | 2/2009 | Fujikura | 257/103 |
| 2010/0229788 | A1 * | 9/2010 | Lo et al. | 117/87 |

FOREIGN PATENT DOCUMENTS

TW 200840082 10/2008

OTHER PUBLICATIONS

Kim et al.—Wurtzite to zinc-blende phase transition in gallium nitride thin films; Applied Physics Letters, vol. 84, No. 5, Feb. 2, 2004, p. 711-713.*
Kim et al. (Wurtzite to zinc-blende phase transition in gallium nitride thin films; Applied Physics Letters, vol. 84, No. 5, Feb. 2, 2004, p. 711-713).*
Jacobs et al., "Internal structure of multiphase zinc-blende wurtzite gallium nitride nanowires," Nanotechnology, vol. 19, pp. 1-6 (2008).
Jacobs et al., "Electronic and Structural Characteristics of Zinc-Blende Wurtzite Biphasic Homostructure GaN Nanowires," Nano Lett., vol. 7, No. 5, pp. 1435-1438 (Apr. 7, 2007).

* cited by examiner

*Primary Examiner* — Cheung Lee
*Assistant Examiner* — Jeremy Joy
(74) *Attorney, Agent, or Firm* — Muncy, Geissler, Olds & Lowe, P.C.

(57) ABSTRACT

A homo-material heterophased quantum well includes a first structural layer, a second structural layer and a third structural layer. The second structural layer is sandwiched between the first and third structural layers. The first structural layer, second structural layer and third structural layer are formed by growing atoms of a single material in a single growth direction. The energy gap of the second structural layer is smaller than that of the first and third structural layers.

1 Claim, 6 Drawing Sheets

HOMO-MATERIAL HETEROPHASED QUANTUM WELL

BACKGROUND OF THE INVENTION

1. Field of the Invention

The present invention generally relates to a quantum well and, more particularly, to a homo-material heterophased quantum well.

2. Description of the Related Art

Gallium Nitride (GaN) has been widely used in producing light-emitting elements due to its broad energy gap, such as light-emitting diodes (LEDs) and laser diodes (LDs). Among various technologies, quantum well technology can improve the light-emitting efficiency of LEDs and LDs. In addition, the quality of quantum well is highly related to the quantum efficiency of the light-emitting elements. Conventional III-nitride quantum well is formed by heterostructures with different energy gaps, such as "GaN/InGaN/GaN". However, the lighting-emitting efficiency of the light-emitting elements could be degraded by lattice mismatch between the heterostructures. Furthermore, due to the strain resulted from the lattice mismatch, electrostatic field generated by the piezoelectric effect of the conventional quantum well will cause some portion of the energy gap of the quantum well to bend. As a result, the quantum efficiency is directly impacted.

To solve the problem of lattice mismatch, Taiwanese Patent Publication Number 200840082 discloses an LED structure produced with zinc oxide (ZnO). The patent epitaxially grows a ZnO buffer layer and a GaN seed layer on a Lithium Aluminum Oxide (LiAlO2) substrate in sequence. Based on the Wurtzite structure similarity between the ZnO and GaN, high quality GaN may be obtained. With the GaN/ZnO/LiAlO2 structure, multiple quantum wells and a first metallic electrode layer are grown. Then, the LiAlO2 substrate and the ZnO buffer layer are removed by way of etching, and a second metallic electrode layer is further grown under the GaN seed layer. Based on this, not only can the single crystal thin film ZnO buffer be used to successfully grow the GaN seed layer on the LiAlO2 substrate, but it can also reduce the defect density of the GaN for nearly lattice match.

In the LED structure produced with ZnO above, the ZnO and GaN can be combined together to reduce the defect density of the GaN due to their similar Wurtzite structures. However, since heterostructures do not have complete matched lattices due to their mismatched atom size and gap, the quantum well formed by the heterostructures cannot provide an improved light-emitting efficiency for the light-emitting elements. Furthermore, since the piezoelectric effect resulting from the lattice mismatch causes some portion of the energy gap of the quantum well to bend, the quantum efficiency of the light-emitting elements is impacted. Therefore, it is desired to overcome the problems by providing a quantum well formed by homo-materials.

SUMMARY OF THE INVENTION

The invention discloses a homo-material heterophased quantum well including a first structural layer, a second structural layer and a third structural layer. The second structural layer is sandwiched between the first and third structural layers. The first structural layer, second structural layer and third structural layer are formed by growing atoms of a single material in a single growth direction. The energy gap of the second structural layer is smaller than that of the first and third structural layers.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

Figure 1:
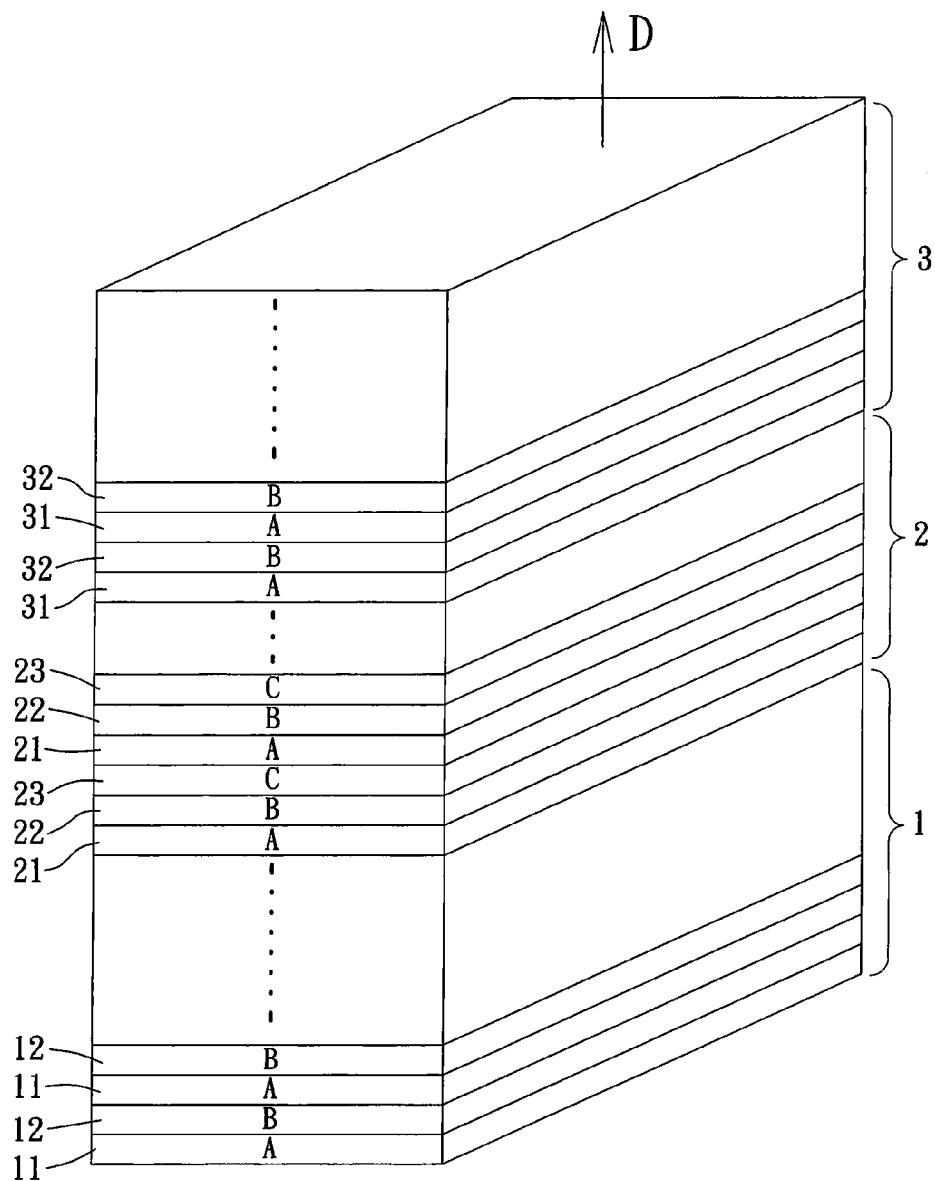
FIG. 1 shows a structure diagram of a homo-material heterophased quantum well according to a preferred embodiment of the invention.

In the various figures of the drawings, the same numerals designate the same or similar parts. Furthermore, when the term "first", "second", "third", "fourth", "inner", "outer" "top", "bottom" and similar terms are used hereinafter, it should be understood that these terms refer only to the structure shown in the drawings as it would appear to a person viewing the drawings, and are utilized only to facilitate describing the invention.

DETAILED DESCRIPTION OF THE INVENTION

Referring to FIG. 1, a structure diagram of a homo-material heterophased quantum well is disclosed according to a preferred embodiment of the invention. The homo-material heterophased quantum well includes a first structural layer 1, a second structural layer 2 and a third structural layer 3, with the second structural layer 2 sandwiched between the first structural layer 1 and the third structural layer 3. The first structural layer 1, second structural layer 2 and third structural layer 3 are formed by growing atoms of a single material in a growth direction D. The second structural layer 2 has a smaller energy gap than the first structural layer 1 and third structural layer 3 to form a quantum well with matched lattices. In the embodiment of the invention, the first structural layer 1 and third structural layer 3 appear to be wurtzite GaN structures, whereas the second structural layer 2 appears to be a zinc-blende GaN structure. However, the first structural layer 1, second structural layer 2 and third structural layer 3 are not limited to the wurtzite GaN and zinc-blende GaN structures.

Specifically, referring to FIG. 1, the first structural layer 1 includes at least a first atom A layer 11 and at least a first atom B layer 12. The first atom A layers 11 are stacked with the first atom B layers 12 in an interlaced manner, such as "ABAB . . . AB". The second structural layer 2 includes at least a second atom A layer 21, at least a second atom B layer 22 and at least an atom C layer 23. The second atom A layers 21, second atom B layers 22 and atom C layers 23 are stacked in a predetermined order, such as "ABCABC . . . ABC". The third structural layer 3 includes at least a third atom A layer 31 and at least a third atom B layer 32. Similarly, the third atom A layers 31 are stacked with the third atom B layers 32 in an interlaced manner, such as "ABAB . . . AB". Overall, the atom arrangement of the homo-material heterophased quantum well of the invention appears to be "ABAB . . . ABCABC . . .

ABAB". Although the wurtzite and zinc-blende GaN structures are well-known in the art, they will still be described later in order to describe the relationship between these two structures and the homo-material heterophased quantum well of the invention.

Figure 2:
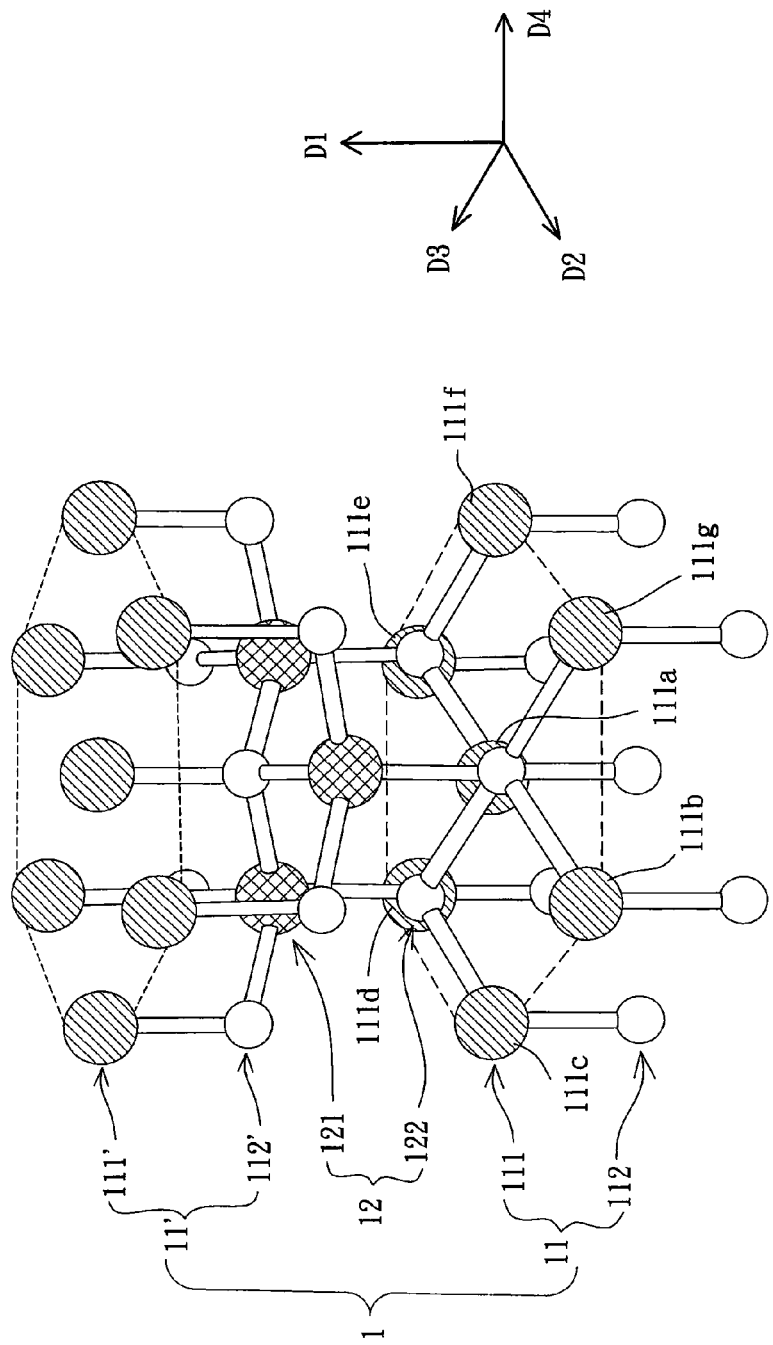
FIG. 2 shows an atom structure of a first structural layer of the homo-material heterophased quantum well according to the preferred embodiment of the invention.

Referring to FIG. 2, an atom structure of the first structural layer 1 is illustrated. In particular, the atom structure of the first structural layer 1 illustrates the relationship among atom layers of the wurtzite GaN. Each of the first atom A layer 11 and first atom B layer 12 is a double atom layer having nitrogen and gallium atoms interlinked together. Each first atom A layer 11 has a gallium atom layer 111 and a nitrogen atom layer 112 interlinked with the gallium atom layer 111. The gallium atom layer 111 includes a hexagonal plane defined by gallium atoms 111a, 111b, 111c, 111d, 111e, 111f and 111g. Adjacent to the first atom A layer 11 is the first atom B layer 12 having a gallium atom layer 121 and a nitrogen atom layer 122 interlinked with the gallium atom layer 121. In addition, adjacent to the other side of the first atom B layer 12 is another first atom A layer 11' having a gallium atom layer 111' and a nitrogen atom layer 112' interlinked with the gallium atom layer 111', with the gallium atom layer 111' appearing to be a hexagonal plane. Based on this, the first structural layer 1 is structurally characterized in that the first atom A layers 11 are stacked with the first atom B layers 12 in the interlaced manner to constantly form the hexagonal wurtzite GaN crystal structure, which is a hexagonal close-packed wurtzite crystal structure. Besides, to describe the hexagonal wurtzite GaN crystal structure in detail, it is assumed that the direction from the nitrogen atom layer 112 to the gallium atom layer 111 is defined as a first direction D1, the direction from the gallium atoms 111a to 111b is defined as a second direction D2, the direction from the gallium atoms 111a to 111d is defined as a third direction D3, and the direction from the gallium atoms 111a to 111f is defined as a fourth direction D4. Here, assuming that a four-axis coordinate system is used to define the four directions, the first direction D1 will be a direction [000-1] of a C axis of wurtzite structure, the second direction D2 will be the direction [0010], the third direction D3 will be the direction [1000] and the fourth direction D4 will be the direction [0100]. Based on this, other directions of the four-axis coordinate system can be derived from the above four directions. In addition, the third structural layer 3 has similar atom structure as the first structural layer 1.

Figure 3:
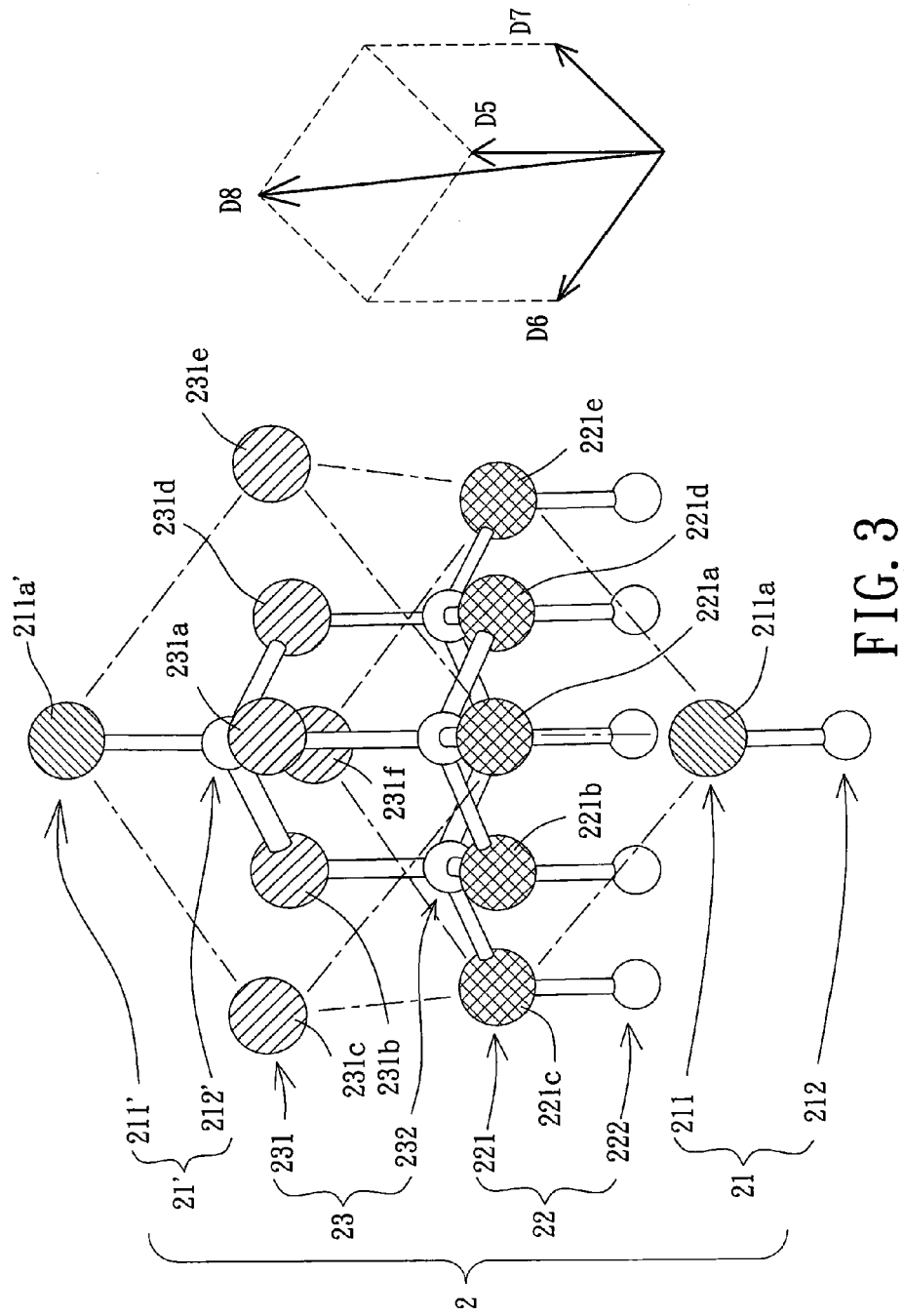
FIG. 3 shows an atom structure of a second structural layer of the homo-material heterophased quantum well according to the preferred embodiment of the invention.

Referring to FIG. 3, an atom structure of the second structural layer 2 is illustrated. In particular, the atom structure of the second structural layer 2 illustrates the relationship among atom layers of the zinc-blende GaN. Each of the second atom A layer 21, second atom B layer 22 and atom C layer 23 is a double atom layer having nitrogen and gallium atoms interlinked together. Each second atom A layer 21 has a gallium atom layer 211 and a nitrogen atom layer 212 interlinked with the gallium atom layer 211. The gallium atom layer 211 includes a gallium atom 211a. Adjacent to the second atom A layer 21 is the second atom B layer 22 having a gallium atom layer 221 and a nitrogen atom layer 222 interlinked with the gallium atom layer 221. The gallium atom layer 211 includes a plurality of gallium atoms 221a, 221b, 221c, 221d and 221e. Adjacent to the other side of the second atom B layer 22 is the atom C layer 23 having a gallium atom layer 231 and a nitrogen atom layer 232 interlinked with the gallium atom layer 231. The gallium atom layer 231 has a plurality of gallium atoms 231a, 231b, 231c, 231d, 231e and 231f. Adjacent to the other side of the atom C layer 23 is the second atom A layer 21' having a gallium atom layer 211' and a nitrogen atom layer 212' interlinked with the gallium atom layer 211'. The gallium atom layer 211' includes a gallium atom 211a'. In this arrangement, the gallium atoms 211a, 221a, 231c, 221c and 221b are coplanar, the gallium atoms 211a, 221a, 231e, 221e and 221d are coplanar, the gallium atoms 211a, 221c, 231f and 221e are coplanar, the gallium atoms 211a', 231f, 221c, 231c and 231b are coplanar, the gallium atoms 211a', 231f, 221e, 231e and 231d are coplanar, and the 211a', 231c, 221a, 231e and 231a are coplanar. The six planes jointly form a face-centered cubic Zinc-blende crystal structure. Therefore, the second atom A layers 21, second atom B layers 22 and atom C layers 23 are stacked in the predetermined order of "ABCABC...ABC" to constantly form a plurality of face-centered cubic zinc-blende crystal structures. Besides, to describe the face-centered cubic zinc-blende crystal structure in detail, it is assumed that the direction from the gallium atoms 211a to 221a is defined as a fifth direction D5, the direction from the gallium atoms 211a to 221c is defined as a sixth direction D6, the direction from the gallium atoms 211a to 221e is defined as a seventh direction D7, and the direction from the gallium atoms 211a to 211a' is defined as an eighth direction D8. Here, assuming that a three-axis coordinate system is used to define the above directions, the fifth direction D5 will be the direction [001], the sixth direction D6 will be the direction [100], the seventh direction D7 will be the direction [0-10] and the eighth direction D8 will be the direction [1-11]. Based on this, other directions of the three-axis coordinate system can be derived from the above four directions.

Since each of the first structural layer 1, second structural layer 2 and third structural layer 3 has at least an atom A layer (namely, the first atom A layer 11, second atom A layer 21 or third atom A layer 31), the atom A layer can be used to link with other atom layer to combine the first structural layer 1, second structural layer 2 and third structural layer 3 together as described below.

Figure 4:
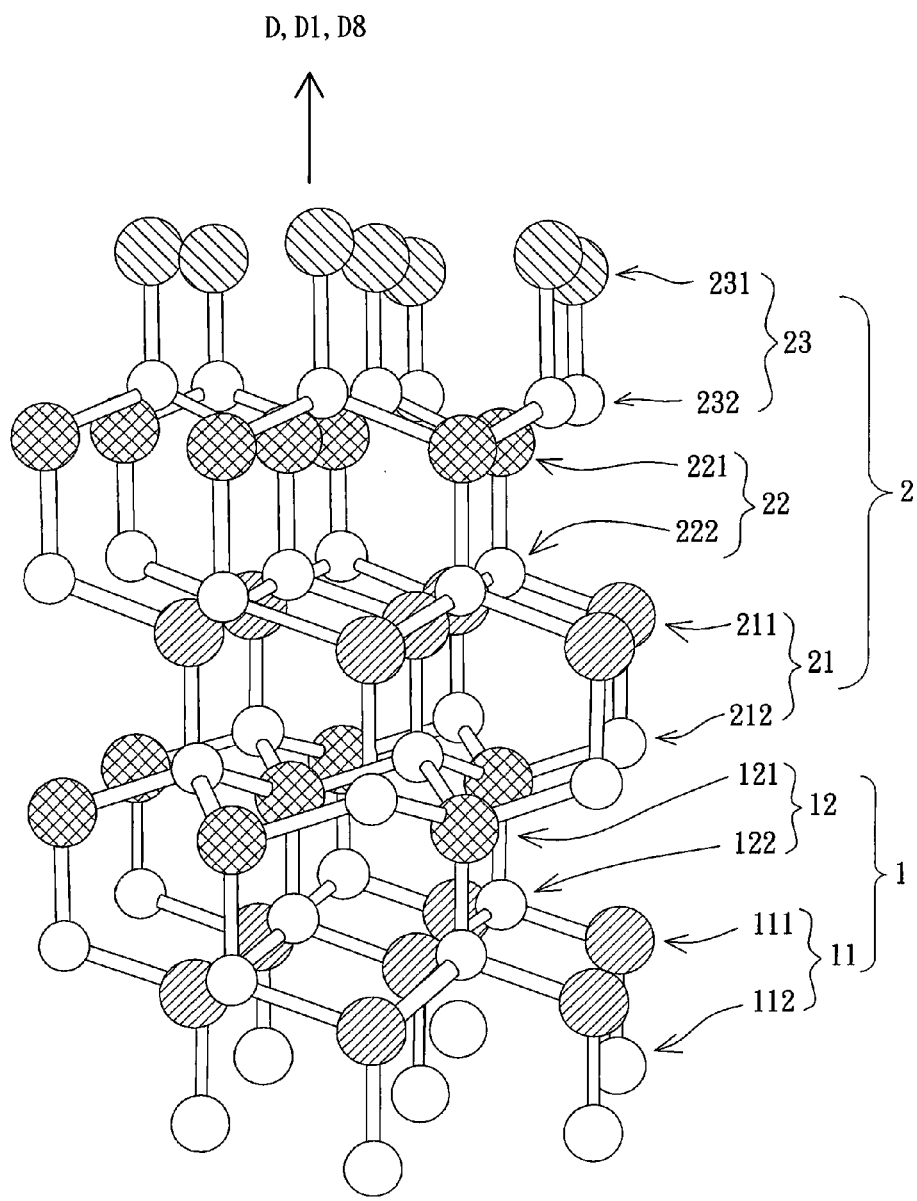
FIG. 4 shows an atom structure diagram of the first structural layer and second structural layer combined together.

Referring to FIG. 4, an atom structure diagram of the first structural layer 1 and second structural layer 2 combined together is shown. Since the first structural layer 1 is formed by the wurtzite GaN, and the eighth direction D8 (namely, the direction [1-11]) of the zinc-blende can be converted from the first direction D1 (namely, the direction [000-1] of the C axis) of the wurtzite GaN, the second atom A layer 21 of the second structural layer 2 may be grown upon the first atom B layer 12 of the first structural layer 1 after the wurtzite GaN is grown in the first direction D1. Thus, the zinc-blende GaN growing in the eighth direction D8 is formed to construct the second structural layer 2. Both the first direction D1 and eighth direction D8 face the growth direction D.

Moreover, a direction [11-20] may be derived from the four-axis coordinate system, and directions [110] and [002] may be derived from the three-axis coordinate system. Based on this, if the direction [110] of the zinc-blende GaN is parallel to the direction [11-20] of the wurtzite GaN, an included angle of 55 degrees is present between plane families {002} and {1-11} of the zinc-blende GaN. In particular, the plane family {002} is a family constituted by all the planes perpendicular to the direction [002] in the zinc-blende GaN. Similarly, the plane family {1-11} is a family constituted by all the planes perpendicular to the direction [1-11] in the zinc-blende GaN.

Figure 5:
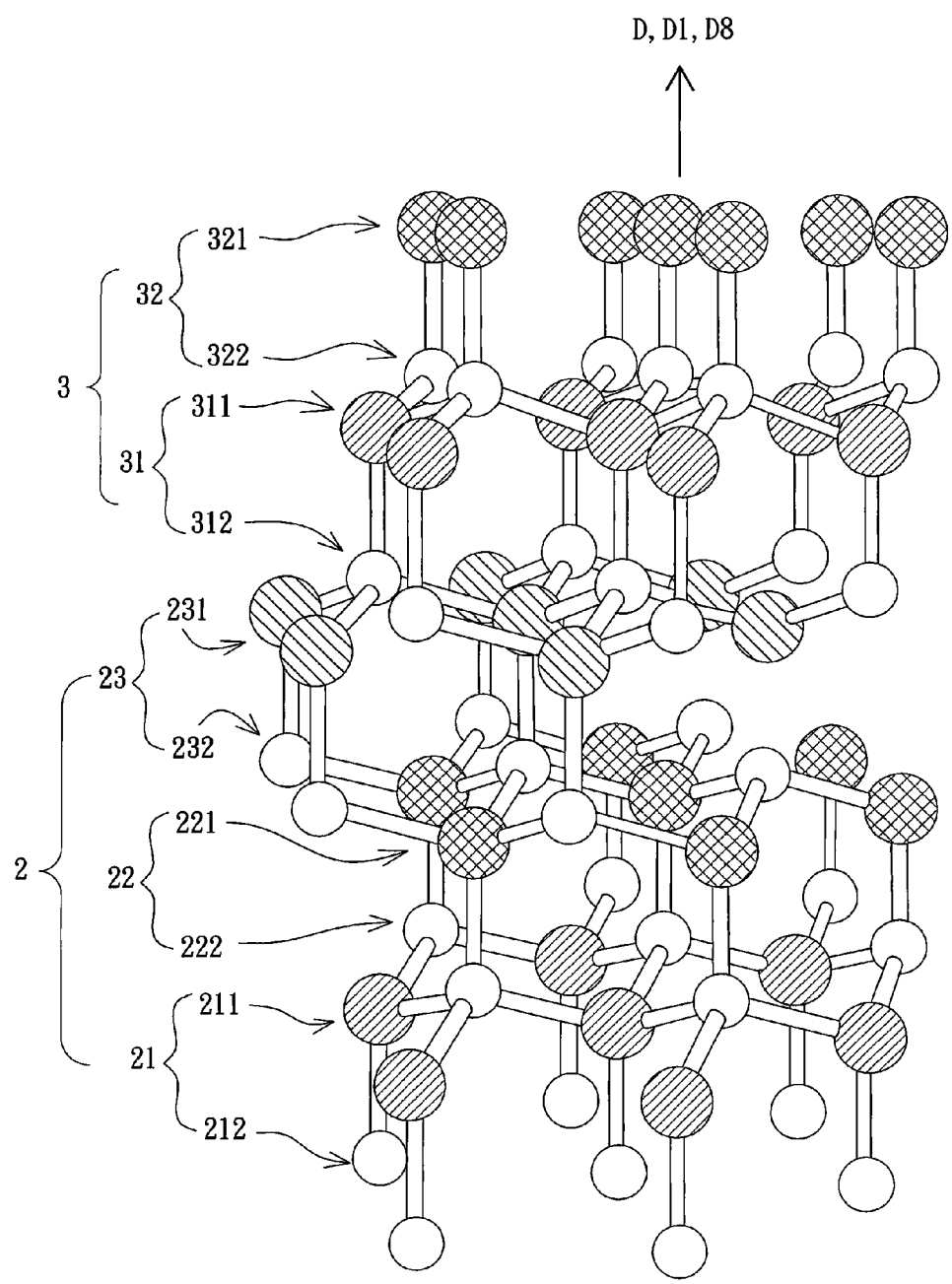
FIG. 5 shows an atom structure diagram of the second structural layer and third structural layer combined together.

Referring to FIG. 5, an atom structure diagram of the second structural layer 2 and third structural layer 3 combined together is shown. Since the second structural layer 2 is formed by the zinc-blende GaN, and the first direction D1 (namely, the direction [000-1] of the C axis) of the wurtzite GaN can be converted from the eighth direction D8 (namely, the direction [1-11]) of the zinc-blende GaN, the third atom A layer 31 of the third structural layer 3 may be grown upon the atom C layer 23 of the second structural layer 2 after the zinc-blende GaN is grown in the eighth direction D8. Thus, the wurtzite GaN growing in the first direction D1 is formed to construct the third structural layer 3. Both the first direction D1 and eighth direction D8 face the growth direction D.

Figure 6:
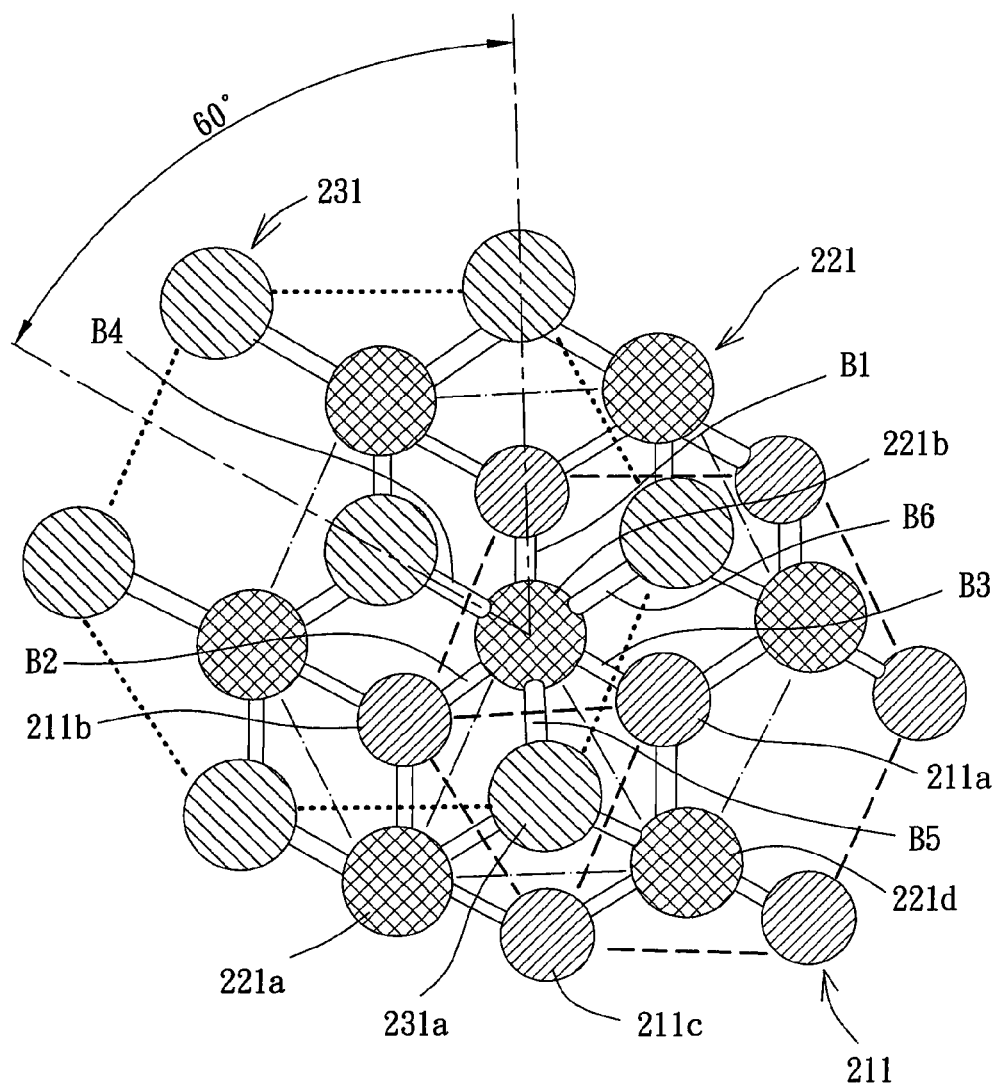
FIG. 6 shows a top view of the homo-material heterophased quantum well according to the preferred embodiment of the invention.

Referring to FIG. 6, a top view of the homo-material heterophased quantum well is shown according to the preferred embodiment of the invention. The second structural layer 2 is used as an example to describe the relationship among the second atom A layer 21, second atom B layer 22 and atom C layer 23. As described above, each of the second atom A layer 21, second atom B layer 22 and atom C layer 23 appears to be the hexagonal plane. The gallium atoms 211a, 211b and 211c of the gallium atom layer 211 and the gallium atoms 221a, 221b and 221d of the gallium atom layer 221 surround the gallium atom 231a of the gallium atom layer 231. In addition, there is a plurality of bindings B1, B2 and B3 between the second atom B layer 22 and second atom A layer 21, as well as a plurality of bindings B4, B5 and B6 between the second atom B layer 22 and atom C layer 23. Specifically, an included angle of 60 degrees is present between the bindings B1 and B4. Similarly, an included angle of 60 degrees is also present between the bindings B2 and B5, and between the bindings B3 and B6.

Based on the above description, if a first layer is the atom A layer (namely, the first atom A layer 11, second atom A layer 21 or third atom A layer 31) and a second layer is an atom B layer (namely, the first atom B layer 12, second atom B layer 22 or third atom B layer 32) grown upon the first layer, then the atom type of a third layer grown upon the second layer will determine the structure of the quantum well. Two possible cases are present as the third layer can be of the atom A layer or the atom C layer. In a first case where the third layer is the atom A layer, the crystal will appear to be the "ABAB...AB" structure. In this case, a hexagonal column of the wurtzite GaN crystal structure is formed along the first direction D1. In the other case where the third layer is the atom C layer, the crystal will appear to be the "ABCABC...ABC" structure. In this case, a face-centered cubic zinc-blende GaN crystal structure is formed along the eighth direction D8. Therefore, the nitrogen-gallium bond of the atom B layer is rotated by 60 degrees to form the atom C layer. Based on this, the atom B and C layers are stacked in the "ABAB...AB" manner to form the wurtzite GaN as the first layer. Then, the atom A, B and C layers are stacked in the "ABCABC...ABC" manner to form the zinc-blende GaN as the second layer. Finally, the atom B and C layers are stacked in the "ABAB...AB" manner to form the wurtzite GaN again as the third layer. Overall, the first, second and third layers are stacked in the "ABAB...ABCABC...ABAB..." manner to form the homo-material heterophased quantum well consisting of two wurtzite GaNs (which grow in the first direction D1) and the zinc-blende GaN (which grows in the eighth direction D8) sandwiched between the two wurtzite GaNs.

Furthermore, since the wurtzite GaN has an energy gap of 3.536 eV, the energy gap of both the first structural layer 1 and third structural layer 3 is 3.536 eV. In addition, based on the facts that the two-dimensional electron gas (2DEG) and the two-dimensional hole gas (2DHG) of the zinc-blende GaN of the homo-material heterophased quantum well will have an energy gap of 3.204 eV at a $n^{th}$ energy gap of the homo-material heterophased quantum well, and the energy gap of the $n^{th}$ energy gap of the homo-material heterophased quantum well is inversely proportional to the thickness of the second structural layer 2 and larger than the energy gap of the original zinc-blende GaN, it may be known that the difference in energy gap between the $n^{th}$ energy gap of the homo-material heterophased quantum well and the first structural layer 1, or between the $n^{th}$ energy gap and the third structural layer 3, is 0.332 eV. Therefore, the first structural layer 1, second structural layer 2 and third structural layer 3 can form a GaN homo-material heterophased quantum well via the two wurtzite GaNs and the zinc-blende GaN sandwiched between the two wurtzite GaNs. Furthermore, the wurtzite GaN has a reflection rate of 2.78 at room temperature. Also, the zinc-blende GaN has a reflection rate of 2.91 at room temperature, and a critical angle of total reflection of 72.8 degrees. This makes the GaN homo-material heterophased quantum well a good waveguide to be applied to a laser diode. Thus, an ideal (flawless, stress-free) GaN homo-material heterophased quantum well can be used to make a high efficient light activator.

In conclusion, since the homo-material heterophased quantum well of the invention is formed by homo-material, lattice match of the homo-material heterophased quantum well can be provided to improve the light-emitting efficiency of the light-emitting elements and to avoid the degradation of the quantum efficiency of the light-emitting elements.

Although the invention has been described in detail with reference to its presently preferable embodiment, it will be understood by one of ordinary skill in the art that various modifications can be made without departing from the spirit and the scope of the invention, as set forth in the appended claims.

What is claimed is:

1. A homo-material heterophased quantum well comprising:
   a first structural layer, a second structural layer and a third structural layer, wherein the second structural layer is sandwiched between the first and third structural layers, wherein the first structural layer, the second structural layer and the third structural layer are formed by growing atoms of a single material in a single growth direction, wherein the energy gap of the second structural layer is smaller than the energy gaps of the first and third structural layers,
   wherein the single material is Gallium Nitride,
   wherein the first structural layer is wurtzite structure,
   wherein the second structural layer is zinc-blende structure,
   wherein the third structural layer is wurtzite structure,
   wherein the wurtzite structure faces the single growth direction in a first direction,
   wherein the first structural layer comprises an atom A layer and an atom B layer interlinked with the atom A layer, wherein the atom A layer has a gallium atom layer and a nitrogen atom layer interlinked with the gallium atom layer, wherein the nitrogen atom layer faces the gallium atom layer in the first direction,
   wherein the zinc-blende structure faces the single growth direction in an eighth direction,
   wherein the second structural layer comprises a first atom A layer, an atom B layer, an atom C layer and a second atom A layer adjacent to the atom C layer, wherein the atom B layer of the second structural layer is sandwiched between the first atom A layer and the atom C layer, wherein the first atom A layer comprises a gallium atom layer having a gallium atom, wherein the second atom A layer comprises a gallium atom layer having a gallium atom, wherein the gallium atom of the gallium atom layer of the first atom A layer faces the gallium atom of the gallium atom layer of the second atom A layer in the eighth direction, and wherein the first direction, the eighth direction and the single growth direction are the same.

\* \* \* \* \*